(12) United States Patent
Michaels et al.

(10) Patent No.: US 7,709,943 B2
(45) Date of Patent: May 4, 2010

(54) STACKED BALL GRID ARRAY PACKAGE MODULE UTILIZING ONE OR MORE INTERPOSER LAYERS

(76) Inventors: Daniel Michaels, 362 Mainsail Rd., Oceanside, CA (US) 92054; William E. Boyd, 39 Alberger, San Clemente, CA (US) 92672

( * ) Notice: Subject to any disclaimer, the term of this patent is extended or adjusted under 35 U.S.C. 154(b) by 625 days.

(21) Appl. No.: 11/350,974

(22) Filed: Feb. 8, 2006

(65) Prior Publication Data
US 2006/0180912 A1    Aug. 17, 2006

Related U.S. Application Data

(60) Provisional application No. 60/652,777, filed on Feb. 14, 2005.

(51) Int. Cl.
H01L 23/02 (2006.01)
(52) U.S. Cl. .................. 257/686; 257/737; 257/777
(58) Field of Classification Search ............. 257/686, 257/700–799
See application file for complete search history.

(56) References Cited

U.S. PATENT DOCUMENTS

| | | | |
|---|---|---|---|
| 5,391,924 A * | 2/1995 | Uchida et al. ............ | 257/789 |
| 5,448,511 A | 9/1995 | Paurus et al. | |
| 5,661,339 A | 8/1997 | Clayton | |
| 6,011,693 A | 1/2000 | Gore | |
| 6,028,352 A | 2/2000 | Eide | |
| 6,084,780 A | 7/2000 | Happoya | |
| 6,323,060 B1 | 11/2001 | Isaak | |
| 6,487,078 B2 | 11/2002 | Kledzik | |
| 6,528,408 B2 * | 3/2003 | Kinsman ................ | 438/613 |
| 6,545,868 B1 | 4/2003 | Kledzik | |
| 6,627,984 B2 | 9/2003 | Bruce | |
| 6,706,971 B2 | 3/2004 | Albert | |
| 6,781,241 B2 | 8/2004 | Nishimura et al. | |
| 6,806,559 B2 | 10/2004 | Gann | |
| 6,900,529 B2 | 5/2005 | Kledzik | |
| 6,924,556 B2 | 8/2005 | Cha | |
| 6,940,729 B2 | 9/2005 | Cady | |
| 6,956,284 B2 | 10/2005 | Cady | |
| 6,967,411 B2 | 11/2005 | Eide | |
| 2004/0018663 A1 | 1/2004 | Michii et al. | |

OTHER PUBLICATIONS

International Search Report and Written Opinion for PCT/US2006/005754 mailed Jul. 26, 2007.
International Preliminary Report on Patentability for PCT/US2006/005754, issued Aug. 14, 2007.

* cited by examiner

*Primary Examiner*—Leonardo Andújar

(57) ABSTRACT

A multilayer module comprised of stacked IC package layers is disclosed. A plurality of layers preferably having ball grid array I/O are stacked and interconnected using one or more interposer layers for the routing of electronic signals to appropriate locations in the module through angularly depending leads. The stack is further comprised of an interface PCB for the routing of electronics signals to and from the layers in the module and for connection to an external circuit.

20 Claims, 6 Drawing Sheets

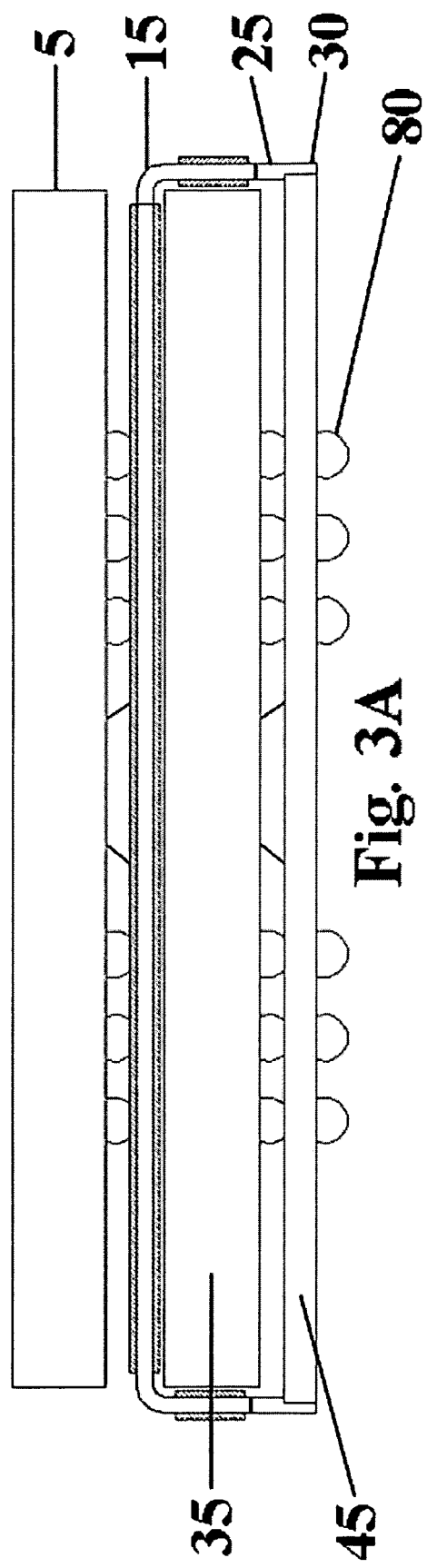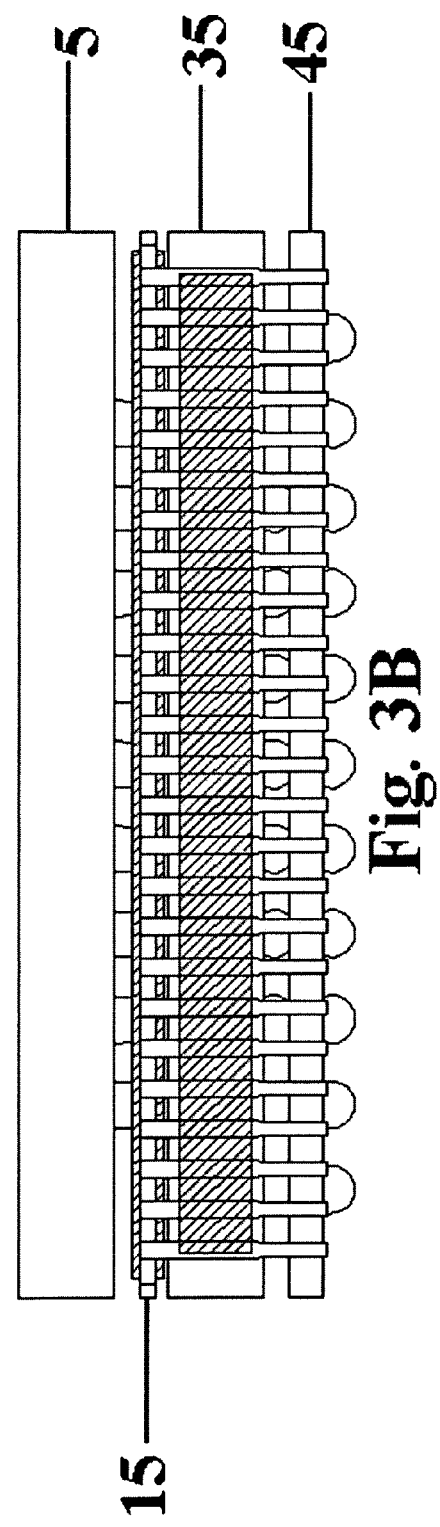
Fig. 3A
Fig. 3B

STACKED BALL GRID ARRAY PACKAGE MODULE UTILIZING ONE OR MORE INTERPOSER LAYERS

CROSS REFERENCE TO RELATED APPLICATIONS

This application is related to U.S. provisional patent application No. 60/652,777 entitled Stacked Ball Grid Array Packages Utilizing Leadframe Interposers, filed Feb. 14, 2005, which is incorporated herein by reference and to which priority is claimed pursuant to 35 U.S.C. 119.

STATEMENT REGARDING FEDERALLY SPONSORED RESEARCH AND DEVELOPMENT

Not applicable

BACKGROUND OF THE INVENTION

1. Background of the Invention

The invention relates generally to stacked microelectronic modules. Specifically, the invention relates to a device comprised of stacked integrated circuit (IC) package layers, such as ball grid array packages (BGA) or flip chip bonded IC chip layers that are interconnected to an external circuit by means of an interposer layer and an interface printed circuit board (PCB).

In the microelectronics industry, there are significant advantages to stacking and interconnecting commercial off the shelf (COTS) integrated circuit packages. The primary advantage of stacking layers is maximum utilization of limited surface area on a printed circuit board. Vertically stacking integrated circuit packages provides increased circuit density without requiring additional printed circuit board space. Further, stacking integrated circuit packages reduces signal lead lengths between the stacked components, reducing parasitic inductance and capacitance, which in turn, allows the circuits to operate at very high clock speeds. The use of COTS components also provides the advantage of ensuring the stack contains fully burned in, tested and functional die, i.e., ensures the use of known good die (KGD) in the stack.

Industry has recognized the value of stacking COTS integrated circuits as is reflected in U.S. Pat. Nos. 6,026,352 to Eide, 6,806,559 to Gann, and 6,706,971, to Albert, all to common assignee, Irvine Sensors Corp. and each of which is incorporated fully herein by reference.

The current microelectronic packaging trend is toward ball grid array packages which comprise an array of solder ball interconnections for I/O to and from the internal integrated circuit die on the lower surface of the BGA package. The solder balls are reflowed on a registered set of conductive pads on an external circuit for interconnection therewith. It is therefore desirable to provide a device that takes advantage of the benefits of stacking and that can accommodate ball grid array packages or other layers that comprise an array of registered I/O pads for interconnection, which device can be adapted for use on a standard BGA printed circuit board pattern.

2. Brief Summary of the Invention

The present invention discloses a device and method comprising a stack of at least two IC package layers, such as ball grid array packages, stacked with an interposer layer. The solder balls of an upper, or first, IC package layer are in electrical connection with a registered set of conductive pads on a surface of the interposer layer. The interposer layer comprises one or more conductive traces for the rerouting of an electrical signal to the appropriate location in the stack and includes one or more angularly depending leads for interconnection with an interface PCB.

The solder balls of a lower, or second, IC package are in electrical interconnection with a registered set of conductive pads on the interface PCB. The interface PCB comprises one or more interface PCB conductive traces on a substrate for the rerouting of electrical signals to or from an external circuit to the appropriate layers in the stack.

In the above manner, multiple pretested BGA packages containing known good die can be efficiently stacked and interconnected in a reliable, low cost microelectronic module.

While the claimed IC layer apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

BRIEF DESCRIPTION OF THE DRAWINGS

FIGS. 3A and 3B illustrate a cross-section and side view respectively, of the electronic module of the invention.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENT

Figure 1:
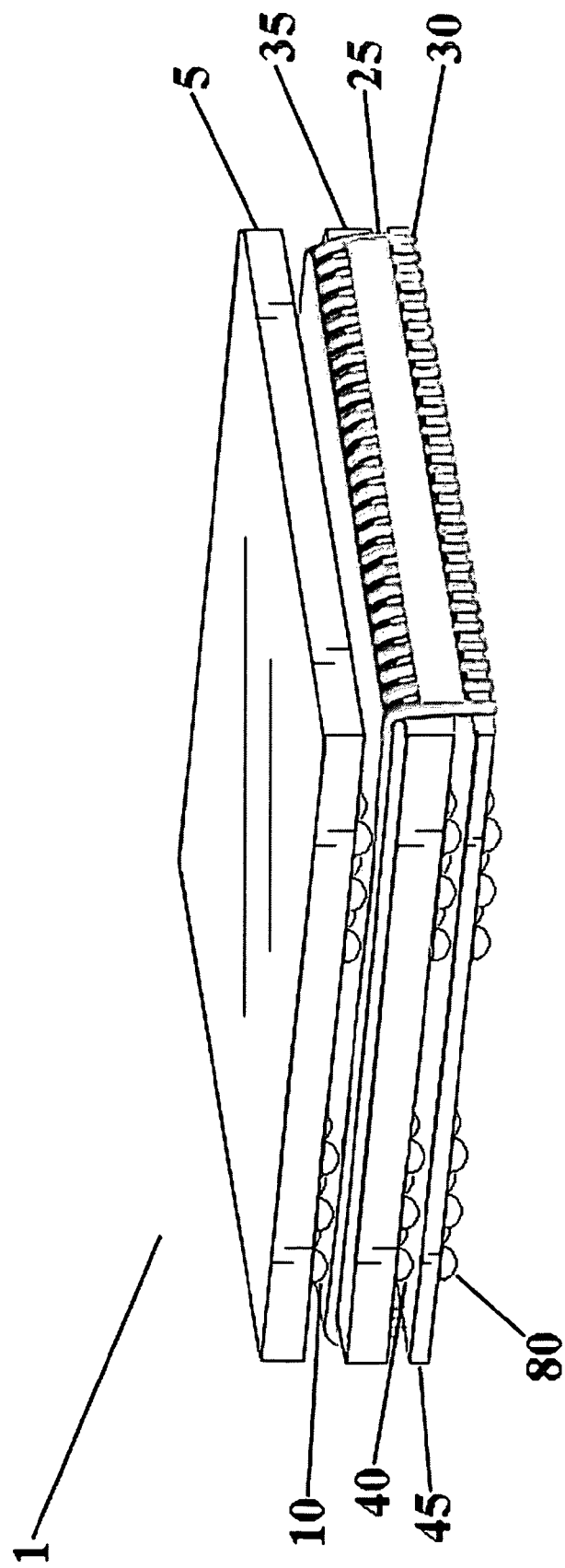
FIG. 1 is a perspective view of a first preferred embodiment of the electronic module of the invention.
Figure 2:
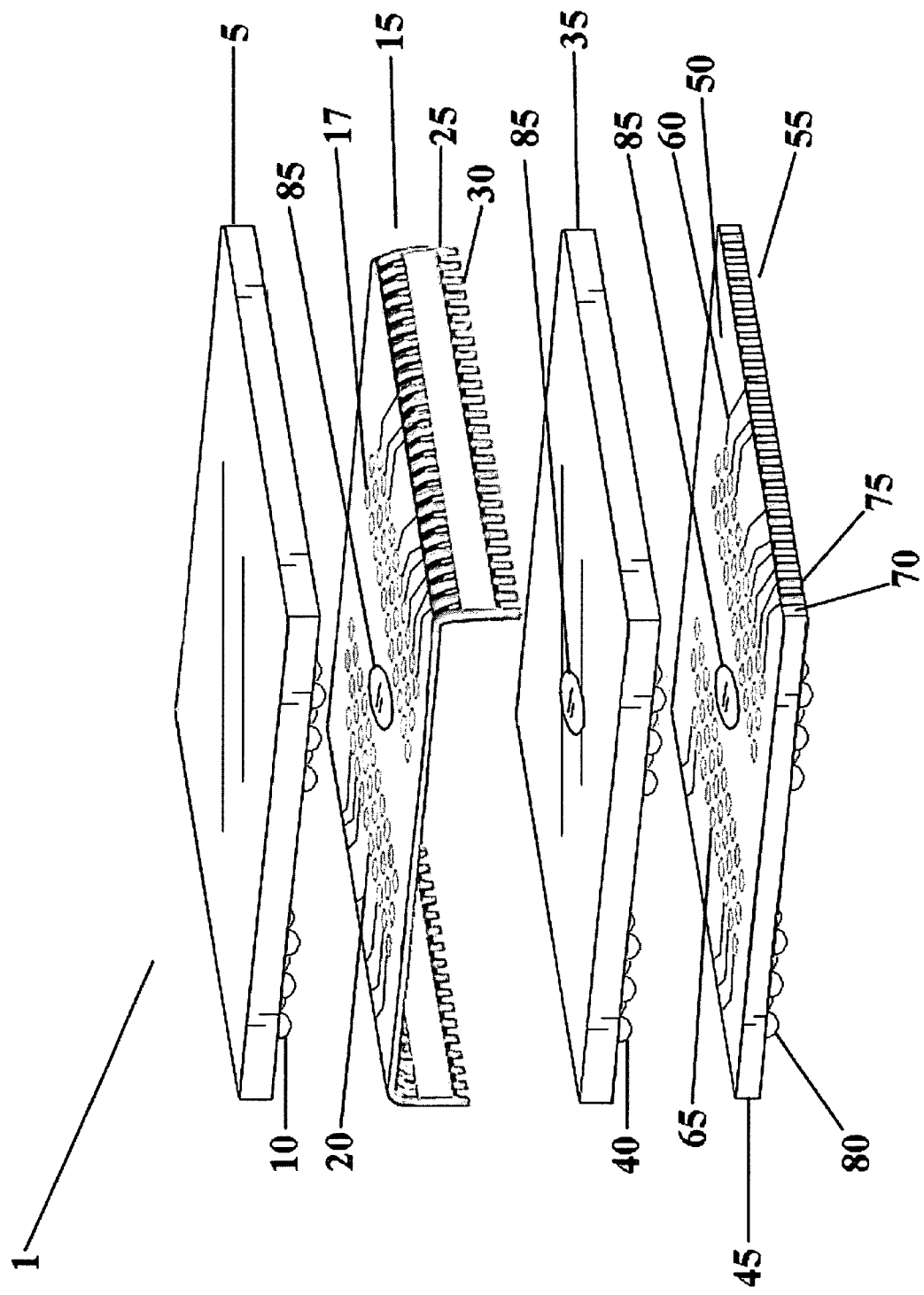
FIG. 2 is an exploded view of the major elements of the electronic module of the invention.

Turning now to the figures wherein like numerals identify like elements among the several views, FIGS. 1 and 2 show a preferred embodiment of the electronic module 1 of the invention in a two IC package layer configuration. It is expressly noted that the invention is not limited to two IC package layers but may comprise three or more IC package layers, dependent upon the end needs of the user.

In the disclosed BGA embodiment, module 1 is comprised of a first IC package layer 5, preferably a commercially available ball grid array package. First IC package layer 5 comprises a plurality of first I/O pads 10, which I/O pads are most typically provided with solder balls for subsequent solder reflow and electrical connection to an external conductive pattern. Other I/O formats may include outwardly depending leads such as are found in thin small outline package (TSOP)

formats. An exemplar BGA package for use in the invention is a 1 Gbit DDR2 SDRAM ball grid array package available from Micron Technology.

Now, also referring to FIGS. 3A and 3B, module 1 is further comprised of an interposer layer 15. Interposer layer 15 is provided with a plurality of interposer conductive pads 17 which are registered and aligned to receive first I/O pads 10 of first IC package layer 5. Interposer layer 15 also comprises a plurality of interposer conductive traces 20 for the routing of electrical signals to appropriate locations within the elements of module 1 as discussed below.

Interposer layer 15 further comprises one or more angularly depending leads 25 each of which has a terminal (end) portion 30. At least one of terminals 30 comprises a portion of interface conductive trace 20 whereby terminal 30 may be put in electrical connection with another element, such as by a solder connection in a via, on a conductive pad, in a plated castellation or forming a conductive T-connect with an external conductive trace.

Figure 4:
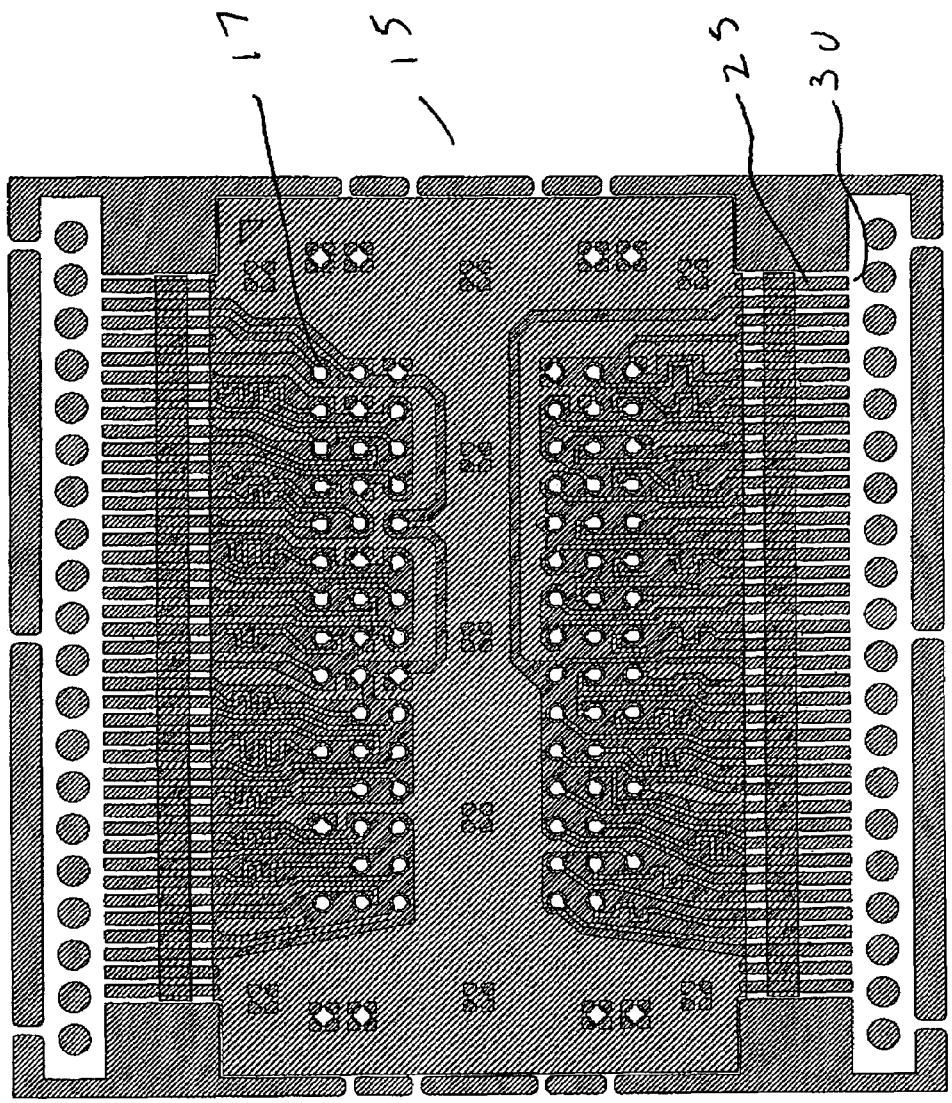
FIG. 4 shows an exemplar interposer layer prior to trim and form of the electronic module of the invention.

FIG. 4 reflects an exemplar interposer layer 15 prior to the trim and form operation which forms the angularly depending leads 25.

A second IC package layer 35, such as a second BGA package, is provided. Second IC package layer 35 comprises a plurality of second I/O pads 40. As above, second I/O pads 40 are most typically provided with solder balls for subsequent solder reflow and electrical connection to an external conductive pattern.

In the illustrated embodiment, module 1 is further comprised of an interface printed circuit board, or interface PCB 45. Interface PCB 45 is comprised of an upper, or first, interface PCB surface 50, a lower, or second, interface PCB surface 55 and a plurality of interface PCB conductive traces 60. Depending upon the end application, interface PCB 45 may comprise a multilayer PCB containing as many layers as necessary to provide electrical signal routing to the first, second, third, etc., layers in the module, dependent upon the final number of layers in the module.

A plurality of interface PCB conductive pads 65 are provided on first interface PCB surface 50 and are in registration with second I/O pads 40 of second IC package layer 35 whereby one or more of second I/O pads 40 can be electrically connected to interface PCB conductive pads 65, such as by soldering or solder reflow. If necessary, a user can provide solder balls on a BGA package using industry standard equipment and processes.

At least one of interface PCB conductive traces 60 terminates at or proximal one or more peripheral surfaces 70 of interface PCB 45 to define at least one interface PCB connection point 75.

Interface PCB connection point 75 serves as the electrical interconnect between terminal 30 of lead 25 of interposer layer 15 and interface PCB 45. Interface PCB connection point 75 may, for example and not by limitation, be comprised of a plated through-hole via, a plated castellation, a conductive pad, a metallized T-connect defined by the cross-section of a conducive trace, or any equivalent means suitable for electrically connecting terminal 30 of lead 25 to an interface PCB conductive trace 60.

Interface PCB conductive traces 60 are provided for the predefined routing of electrical signals (i.e., power, ground, data 1-n, chip enable, etc.) from a plurality of third I/O pads 80 variously to predefined ones of second I/O pads 40 of second IC package layer 35 (i.e., the layer disposed upon interface PCB 45) or to predefined ones of interface PCB connection points 75 at peripheral surface 70. The interface PCB connection points 75, in turn, route the signals through connected leads 25 of interposer layer 15 to interposer conductive pads 17 and to predetermined ones of first I/O pads 10 of first IC package layer 5. By providing for the routing of signals to predetermined locations in the layers in the module stack (i.e., common power, ground, WE, CS, data, etc.) a flexible, high-density memory module is provided. In this manner, a user may selectively enable an individual IC package layer in the module or simultaneously enable two or more layers to provide variably wide data words.

As can be seen in FIGS. 1 and 3b, leads 25 must be of sufficient length and appropriately angularly disposed with respect to the plane of interposer layer 15 so as to engage interface PCB connection point 75 such that an adequate solder joint or electrical connection can be created.

As stated above, in a preferred embodiment, interface PCB connection point 75 is a metallized castellation defined along a peripheral surface 70 for the receiving and electrical connection of a terminal 30 of lead 25. In this embodiment, terminals 30 rests within their respective castellations, which are intended to facilitate the solder interconnection process during manufacturing. Use of a castellation for lead interconnection is not a limitation of the instant invention and it is expressly noted that any suitable means of electrically connecting terminal 30 to an interface PCB connection point may be used such as surface mounting a lead on a pad using a solder connection or equivalent means.

In the castellation embodiment, the respective lead/castellation portions of peripheral edge 70 may be electrically connected, such as by soldering, in a single solder operation or individually. The inwardly opposing compression of leads 25 into opposing castellations of interface PCB 45 assists in creating a stable solder joint during the solder-dip manufacturing step. This particular orientation of the leads within the castellations allows a strong and stable solder fillet to be created.

A preferred construction of interposer layer 15 is a conductive pattern etched from a 4 or 6 mil conductive material, such as copper, which is provided with a solder mask cover layer as is commonly known in the printed circuit board arts. Terminals 30 and interposer conductive pads 17 are exposed for subsequent soldering. All exposed copper is desirably plated to enhance solderablity in later process steps. This preferred embodiment of interposer layer 15 utilizes photo-etched conductive traces and leads with a top and bottom solder mask. Exposed leads are desirably formed/bent with a minimal, (e.g., 0.004") radius bend.

Interface PCB 45 is fabricated using industry-standard PCB manufacturing processes. Preferably, all active signal traces in interposer layer 15 and interface PCB 45 are a matched length to minimize parasitic impedance issues.

The preferred embodiment of the invention may further comprise an adhesive 85, such as an epoxy, bonding at least one IC package layer in the module to the interposer layer and an adhesive bonding the lower-most IC package layer to the first interface PCB surface 50.

Multiple interface PCBs 45 can desirably be manufactured in strips where through-hole vias are first drilled in a strip comprising multiple PCB substrates at the location where the castellations will be defined. During the PCB strip manufacturing process, the through-holes are plated in a solder plating process. In a later manufacturing step, the strip is saw-cut along the centerline of the now-plated vias which in turn creates a plated castellation for the receiving of lead 25 at interface PCB connection point 75.

Second interface PCB surface 55 is provided a plurality of third I/O pads 80, preferably solder balls, that are in electrical connection with appropriate first and second I/O pads via interface PCB 45 and interposer layer 15 for electrical connection to an external circuit. Third I/O pads 80 are in registry with a user defined pattern such that, upon electrical connection, as by solder reflow, third I/O pads 80 are in electrical connection with a user-defined conductive pattern on an external circuit, for example, an external printed circuit board. It is expressly noted that the means of interconnection to an external circuit are not limited to solder balls but may include wire bonding, conductive epoxies or any other suitable means for electrical connection which may now or in the future exist.

Figure 5:
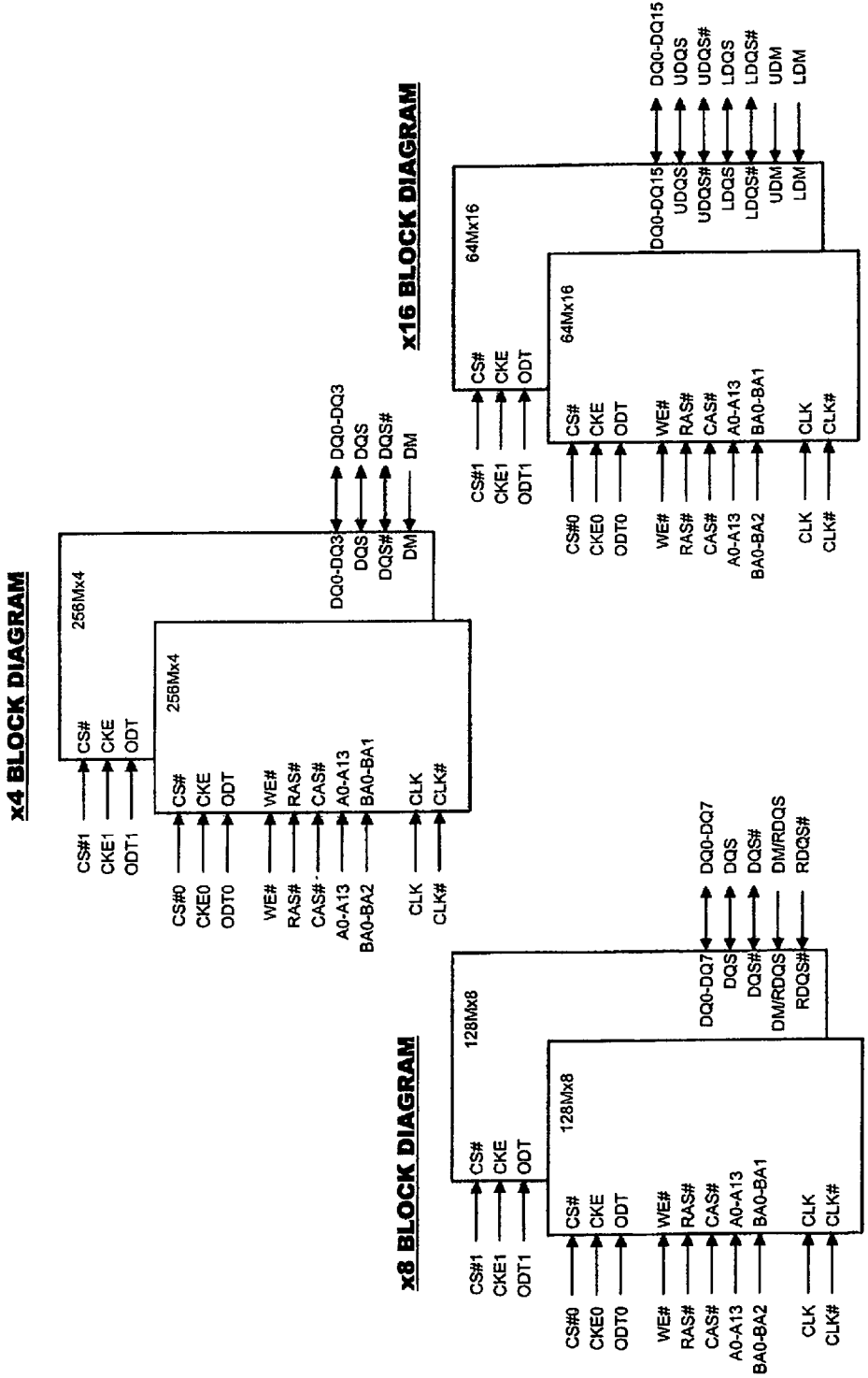
FIG. 5 illustrates various data word width configurations for a memory chip.

Depending on the selected chip set and design of the interposer layer and interface PCB, multiple word widths or memory back configurations can be provided in computer memory chip applications. By way of example and not by limitation, a 2 Gbit, DDR2 SDRAM BGA memory stack can be configured as a 4-bit, 8-bit or 16-bit word. Block diagrams showing exemplar 64×16, 128×8 or 256×4 word formats are shown in FIG. 5

Many alterations and modifications may be made by those having ordinary skill in the art without departing from the spirit and scope of the invention. For instance, by way of example and not by limitation, a flip chip integrated circuit chip layer may comprise one or more layers in the module wherein the interposer conductive pads are provided so as to receive the smaller grid array of a flip chip IC. In this configuration, the IC chip is preferably encapsulated in a protective epoxy, also referred to as a "glob top" as is well known in the semiconductor arts.

Further, a thermal management means such as a thermally conductive epoxy, or heat spreader made of a thermally conductive metal, micro heat pipe layer or other material can be provided between interposer layer 15 and the upper surface of a ball grid array package in a layer. Appropriate selection of a heat-sinking layer provides a heat transfer path for the efficient removal of heat to the environment during high temperature module operation In yet a further alternative embodiment, one or more of the layers in a module may be adapted to comprise a TSOP package wherein the stack is a heterogeneous module comprising BGA and TSOP packages. In this embodiment, the downwardly depending leads of the TSOP package are electrically connected to the interposer layer as is disclosed in U.S. Pat. No. 6,026,352 to Eide.

Figure 6A:
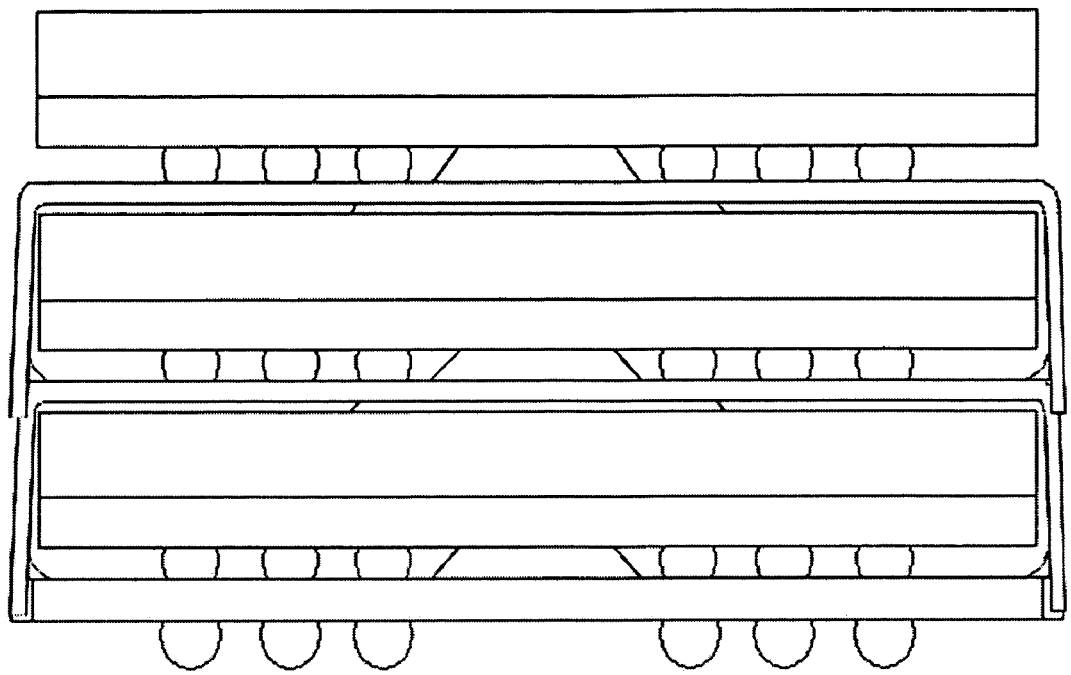
FIGS. 6a and 6b show alternative embodiments of the invention in a three IC package layer configuration.
Figure 6B:
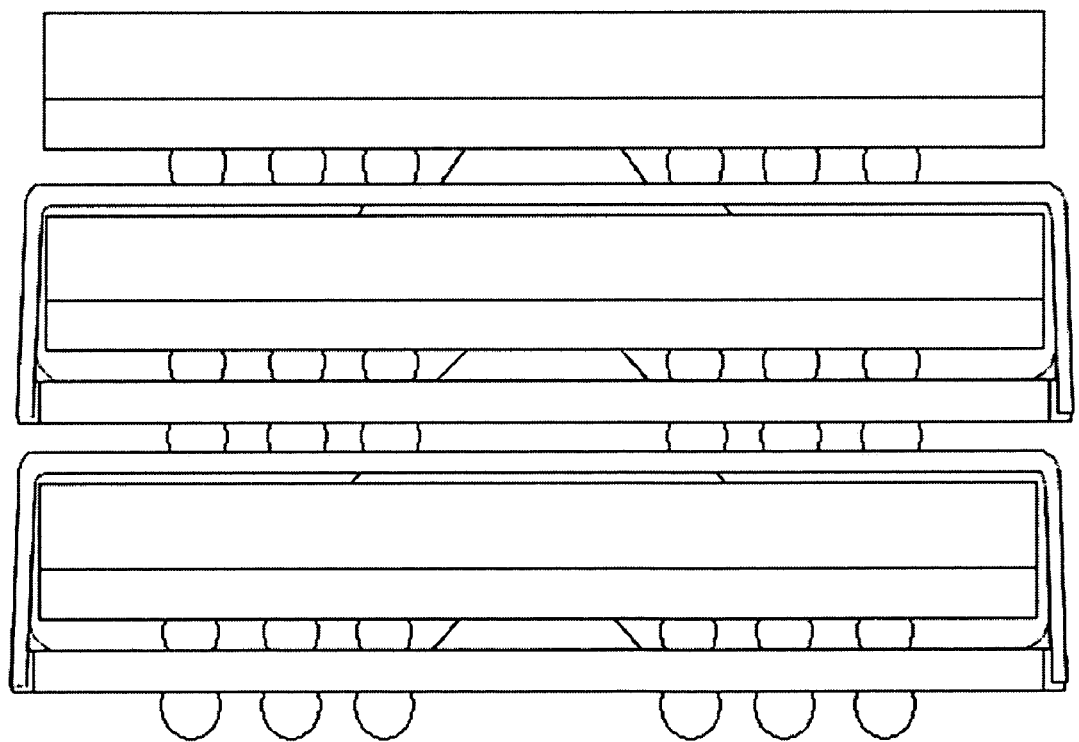

In yet a further alternative embodiment, such as reflected in FIGS. 6a and 6b, the module may comprise three or more IC package layers, each layer containing at least one integrated circuit chip. In this embodiment, the interposer layers and/or interface PCBs from the third, fourth or higher layers interconnect to appropriate connection points in the module such that electrical signals are routed to predefined locations in the upper layers via the adjacent upper interposer layer and/or interface PCB.

Therefore, it must be understood that the illustrated embodiment has been set forth only for the purpose of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed even when not initially claimed in such combinations.

The words used in this specification to describe the invention and its various embodiments are to be understood not only in the sense of their commonly defined meanings, but to include by special definition in this specification, structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are therefore defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Although elements may be described above as acting in certain combinations and even initially claimed as such, it is to be expressly understood that one or more elements from a claimed combination can, in some cases be excised from the combination and that the claimed combination may be directed to a sub-combination or variation of a sub combination.

Insubstantial changes from the claimed subject matter as viewed by a person with ordinary skill in the art, now known or later devised, are expressly contemplated as being equivalent within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the fundamental idea of the invention.

We claim:

1. An electronic module comprising:
   a first integrated circuit (IC) package layer including a first plurality of I/O pads;
   an interposer layer including a plurality of angularly-depending leads, wherein at least one of the leads comprises a terminal configured to route an electrical signal to at least one I/O pad of the first plurality of I/O pads;
   a second IC package layer including a second plurality of I/O pads; and
   an interface printed circuit board (PCB) including:
      a plurality of conductive traces configured to route electrical signals from a third plurality of I/O pads to at least some of the second plurality of I/O pads and at least some of the first plurality of I/O pads; and
      at least one castellation connection point on a peripheral edge of the interface PCB;
   wherein the angularly-depending leads have sufficient lengths and are appropriately angularly disposed with respect to the plane of the interposer layer to engage the at least one castellation connection point to form an electrical connection.

2. The electronic module of claim 1, wherein at least one of the first or second IC package layers comprises a ball grid array package.

3. The electronic module of claim 1, wherein at least one of the first or second IC package layers comprises a flip-chip bonded IC chip.

4. The electronic module of claim 1, wherein at least one of the first or second IC package layers comprises a TSOP package.

5. The electronic module of claim 1, wherein the at least one castellation connection point is on a peripheral surface of the interface PCB.

6. The electronic module of claim 1, wherein each of the first and second IC package layers comprises a ball grid array package.

7. The electronic module of claim 1, further comprising a thermal management layer disposed between the first and second IC package layers.

8. The electronic module of claim 7, wherein the thermal management layer is a thermally-conductive adhesive.

9. A system comprising:
   a plurality of integrated circuit (IC) package layers, each having a plurality of I/O pads;
   an interposer layer disposed between two of the plurality of IC package layers, wherein the interposer layer includes a plurality of angularly-depending leads, and wherein at least some of the leads include terminals configured to route an electrical signal to at least one I/O pad from the pluralities of I/O pads; and
   an interface printed circuit board (PCB) electrically and mechanically coupled to one of the IC package layers, wherein the interface PCB includes:
      a plurality of conductive traces configured to route electrical signals among at least some of the I/O pads from the pluralities of I/O pads; and
      at least one castellation connection point located on a peripheral edge of the interface PCB and configured to receive one of the terminals from the interposer layer to form an electrical connection.

10. The system of claim 9, wherein at least one of the two IC package layers having the interposer layer therebetween comprises a ball grid array package.

11. The system of claim 9, wherein at least one of the two IC package layers having the interposer layer therebetween comprises a flip-chip bonded IC chip.

12. The system of claim 9, wherein at least one of the plurality of IC package layers comprises a TSOP package.

13. The system of claim 9, wherein the at least one castellation connection point is on a peripheral surface of the interface PCB.

14. The system of claim 9, wherein each of the two IC package layers having the interposer layer therebetween comprises a ball grid array package.

15. The system of claim 9, further comprising a thermal management layer disposed between the two IC package layers having the interposer layer therebetween.

16. The system of claim 15, wherein the thermal management layer comprises a thermally-conductive adhesive.

17. An apparatus comprising:
   a plurality of integrated circuit (IC) package layers, each having a plurality of I/O pads;
   an interposer layer disposed between two of the plurality of IC package layers, wherein the interposer layer includes a plurality of angularly-depending leads, and wherein at least some of the leads include terminals configured to route an electrical signal to at least one I/O pad from the pluralities of I/O pads; and
   an interface printed circuit board (PCB) electrically and mechanically coupled to one of the IC package layers, wherein the PCB includes:
      a plurality of conductive traces configured to route electrical signals among at least some of the I/O pads from the pluralities of I/O pads, the leads, or external I/O pads; and
      at least one castellation connection point located on a peripheral edge of the interface PCB and configured to receive one of the terminals from the interposer layer to form an electrical connection.

18. The apparatus of claim 17, further comprising a thermal management layer disposed between two of the plurality of IC package layers.

19. The apparatus of claim 18, wherein the thermal management layer comprises a thermally-conductive adhesive.

20. The apparatus of claim 19, wherein the plurality of IC package layers comprise at least one of a flip-chip bonded IC chip, a TSOP package, or a ball grid array package.

* * * * *